United States Patent
Chang et al.

(10) Patent No.: US 6,613,156 B2
(45) Date of Patent: Sep. 2, 2003

(54) APPARATUS AND METHOD FOR PHOTORESIST STRIPPING

(75) Inventors: Yih Chang, Chung-Ho (TW); Tien-Rong Lu, Tainan (TW)

(73) Assignee: Ritek Display Technology Corporation, Hsinchu (TW)

( * ) Notice: Subject to any disclaimer, the term of this patent is extended or adjusted under 35 U.S.C. 154(b) by 125 days.

(21) Appl. No.: 09/767,300

(22) Filed: Jan. 23, 2001

(65) Prior Publication Data

US 2002/0124875 A1 Sep. 12, 2002

(30) Foreign Application Priority Data

Oct. 12, 2000 (TW) ...................................... 89217656 U (51) Int. Cl.[7] .............................................. B08B 3/00
(52) U.S. Cl. ............................. 134/30; 134/43; 134/48; 134/60; 134/61; 134/70; 134/71; 384/50; 433/173; 528/201
(58) Field of Search ...................... 134/43, 48, 60, 134/61, 30, 70, 71, 72–76; 385/50; 433/173; 528/201

(56) References Cited

U.S. PATENT DOCUMENTS

| | | | | |
|---|---|---|---|---|
| 3,604,435 A | * | 9/1971 | Day et al. ...................... 134/61 |
| 6,001,191 A | * | 12/1999 | Kamikawa et al. ............ 134/32 |
| 6,199,564 B1 | * | 3/2001 | Yokomizo ..................... 134/78 |
| 6,244,279 B1 | * | 6/2001 | Bowden ....................... 134/71 |
| 6,342,104 B1 | * | 1/2002 | Kamikawa et al. ............ 134/26 |
| 6,347,637 B1 | * | 2/2002 | Musha et al. ............. 134/64 R |
| 6,383,303 B1 | * | 5/2002 | Wee et al. ....................... 134/2 |
| 6,430,841 B1 | * | 8/2002 | Borkowski et al. ........... 34/557 |
| 6,435,199 B1 | * | 8/2002 | Kamikawa ................... 134/76 |

* cited by examiner

*Primary Examiner*—Randy Gulakowski
*Assistant Examiner*—Gentle E. Winter
(74) *Attorney, Agent, or Firm*—J.C. Patents (57) ABSTRACT

A photoresist stripping apparatus and a corresponding method for removing photoresist layers after a patterned polyimide layer is developed. The photoresist-stripping apparatus includes a transporting unit, a stripping unit, a washing unit, a drying unit and a control unit. The transporting unit connects the stripping unit, the washing unit and the drying unit. The control unit is responsible for controlling the transport sequence and timing of the transporting unit. The method of stripping the photoresist layer off the OLED panel includes providing a stripping solution to the stripping unit to remove photoresist layers. The OLED panel is jet-cleaned with a washing solution in the washing unit so that any residual stripping agent is removed. Finally, the surface of the OLED panel is blown dry.

16 Claims, 5 Drawing Sheets

APPARATUS AND METHOD FOR PHOTORESIST STRIPPING

CROSS-REFERENCE TO RELATED APPLICATION

This application claims the priority benefit of Taiwan application serial no. 89217656, filed Oct. 12, 2000.

BACKGROUND OF THE INVENTION

1. Field of Invention

The present invention relates to an apparatus and corresponding method for stripping off a photoresist layer. More particularly, the present invention relates to an apparatus and corresponding method for stripping off a photoresist layer after a patterned polyimide layer is developed.

2. Description of Related Art

Organic light-emitting display (OLED) is a self-illuminating, high brightness, high contrast, wide viewing angle, low driving voltage and high response rate device. In fact, OLED is a new generation of flat panel display that holds great promise in the near future. However, due to immature techniques, many technical aspects for forming an OLED device remain unresolved. Hence, only one of the Japanese companies, Pioneer, has developed and put up some OLED device in some of their small dimensional products with a small scale mass production.

Photoresist stripping is a process normally used in the last step of a photolithography for producing a semiconductor or display device. The purpose of the photoresist stripping is to remove the photoresist protective cover used in a previous pattern etching so that no residual photoresist is remainined to affect the next process of photolithography. Hence, a clean substrate with circuit pattern thereon is obtained. However, for each photoresist stripping after the formation of, for example, the electrode connection layer, the indium-tin-oxide (ITO) anode layer and the isolation layer on each OLED panel, some residual photoresist material will remain on the OLED panel. This is because the ITO substrate used in the OLED panel has a rougher surface than a conventional epitaxial Si substrate that forms semiconductor circuits. Consequently, residual photoresist can more readily stick on the surface of the ITO panel. Once photoresist remains on the panel surface, especially in the ITO anode region, subsequent vapor deposition of organic light-emitting material and cathode material will be tricky. Dark spots may appear on the display panel and quality of the display may considerably decline. In addition, the subsequently deposited organic light-emitting layer is relatively thin. The non-uniformly distributed residual photoresist on the panel may create a non-uniform electric field that can lead to possible device short-circuiting and decreased the operating lifetime of the device.

In general, a photoresist layer is used to pattern a non-photosensitive polyimide layer. Polyimide is a material having high thermal stability, physical stability, electrical stability and photoelectric stability. Ultimately, the OLED panel with a Polyimide layer can have better light-emitting stability and a longer lifetime. The patterning process includes coating a polyimide or polyimide precursor over a substrate and then coating a photoresist layer over the polyimide layer. A series of operations such as pre-baking, exposure, post-exposure baking, photoresist developing, photoresist stripping, high-temperature baking is sequentially conducted to form a pattern in the polyimide layer. However, the Polyimide is apt to damage by the alkaline stripping agent such as KOH before the ultimate step of high-temperature baking. Hence, the selection of stripping agent and the control of stripping time are significantly important to OLED lithography process. Photoresist stripping in a conventional integrated circuit and photoelectric fabrication process includes spinning a silicon substrate by attaching the substrate onto a suction spinner. While the silicon substrate is spinning, stripping solution and rinsing solution are sprayed simultaneously and continuously. Finally, the silicon substrate is spun dry at a high speed. However, as size of a display panel increases and with glass substrate replacing silicon substrate, a conventional spinning spinner can hardly support such heavy loading and the centrifugal force created at high spinning rate can be dangerous. Therefore, the aforementioned photoresist stripping process is bound to remain some residual photoresist and lead to a great reduction of process yield. An alternative method is to immerse the display panel in various baths containing alkaline solution and then rinsing with water thereafter. Yet, this is a non-continuous process because the display panel has to be taken out, either manually or mechanically, after each immersion treatment. Hence, not only is the total processing time increased, but the operation of large display panel is very troublesome and inconvenient too. Moreover, if the display panels are handled manually in the stripping process, damages caused by delays or human errors are additional factors that must be considered in the continuous mass productionline. In brief, most conventional setup can hardly well control photoresist stripping and ensure an acceptable quality in mass production scale of OLED.

Furthermore, the polyimide used for producing the OLED panel must go through a final baking at a high temperature of between 220~350° C. Only after the final baking step will the polyimide layer have the high electrical, mechanical, thermal and chemical stability an OLED panel required. Before the final thermal baking, chemical stability of polyimide is not well established. Hence, the polyimide material is apt to damages by corrosive alkaline stripping agents. In other words, the alkaline solution such as sodium hydroxide and potassium hydroxide used for stripping photoresist in the conventional technique may often lead to partial stripping and dissociation of the polyimide layer on the OLED panels. To diminish polyimide damage on the OLED panels, timing of the photoresist stripping has to be accurately monitored and controlled, and stripping agents has to be carefully selected. In conclusion, the stripping process of the polyimide layer on the OLED panel has to be designed to increase yield, stability, automaticity and capacity.

SUMMARY OF THE INVENTION

Accordingly, one object of the present invention is to provide an apparatus and corresponding method for stripping a photoresist layer off an organic light-emitting display (OLED) panel. The stripping process not only can produce an OLED panel with high degree of surface cleanliness, but also can operate continuously to deal with display panel of various sizes. Hence, the setup and method is suitable for stripping photoresist layer from OLED panel in mass production.

To achieve these and other advantages and in accordance with the purpose of the invention, as embodied and broadly described herein, the invention provides a photoresist stripping apparatus and a corresponding method for removing photoresist material after a polyimide layer on an organic light-emitting display panel is patterned. The photoresist-stripping apparatus includes a transporting unit, a stripping unit, a washing unit, a drying unit and a control unit. The transporting unit connects the stripping unit, the washing unit and the drying unit. The control unit is responsible for controlling the transport sequence and timing of the transporting unit. The apparatus may further include a carrier unit serving as a storage area for holding display panels waiting for photoresist stripping. Alternatively, the carrier unit may serve as a buffer region for storing display panels after photoresist development so that the display panels can be directly transferred to the stripping apparatus. The apparatus may further include a downloading unit serving as a storage area for storing photoresist stripped display panels. Alternatively, the downloading unit may serve as a buffer region for storing the display panels after photoresist stripping so that the display panel can be directly transferred to a subsequent high-temperature baking module instead of a downloading unit.

The transporting unit is responsible for transferring OLED panels into the stripping unit, the washing unit and the drying unit sequentially and continuously. The transporting unit includes a roller unit. Each roller unit further includes an axle and two rollers attached to each end of the axle. Each roller has an inner edge serving as a load support and an outer edge serving as a retainer. The load supporting inner edge is used for supporting OLED panels while the outer edge is responsible for restricting the horizontal movement of the OLED panels supported by the rollers. The OLED panels are transported from one location to another via the rolling action provided by the rollers.

The stripping unit at least includes an n-butyl acetate (NBA) stripping bath and an isopropyl alcohol (IPA) stripping bath. The NBA bath includes a storage tank, a liquid supply system and a reaction chamber. The storage tank is a storage area for n-butyl acetate. NBA liquid in the storage tank is transferred to the reaction chamber through the liquid supply system. The NBA liquid reacts with the OLED panels shuttling inside the reaction chamber to strip off surface photoresist. The shuttling motion of OLED panels inside the reaction serves to even out and quicken the removal of the photoresist material. The liquid supply system injects the n-butyl acetate into the reaction chamber. Through immersion, spraying or partial immersion and spraying of the n-butyl acetate, photoresist on the surface of the OLED panel is gradually dissolved and carried away. The stripping unit includes at least one n-butyl acetate stripping bath. If more than one n-butyl acetate stripping baths are used, these stripping baths may be arranged serially or in parallel or a mixture of both. The advantage of connecting the stripping bath in parallel is that high volumes of OLED panels can be processed at the same time. The advantage of connecting the stripping bath in series is that the same OLED panel can receive consecutive photoresist stripping so that the panel is ultimately much cleaner. In a system having serial and parallel stripping baths, the advantages of both arrangements are obtained. In addition, the deployment of two or more stripping baths can avoid stoppage when n-butyl acetate needs to be flushed from a stripping bath.

The isopropyl alcohol stripping bath is positioned behind the n-butyl acetate stripping bath. The isopropyl alcohol stripping bath at least includes an isopropyl alcohol stripping bath. If more than one isopropyl alcohol stripping baths are used, the stripping baths can be arranged in parallel or in series similar to the n-butyl acetate stripping baths. The isopropyl alcohol stripping bath serves to remove any residual photoresist on the OLED panel surface and displace any residual n-butyl acetate from the surface of the OLED panel. Each isopropyl alcohol stripping bath also includes a storage tank, a liquid supply system and a reaction chamber. The storage tank holds the isopropyl alcohol. Isopropyl alcohol is pumped from the storage tank to the reaction chamber by the liquid supply system so that the OLED panel can be treated. Because isopropyl alcohol has a relatively low boiling point, the OLED panels are treated by immersion rather than by spraying to reduce alcohol vapor generation. In general, the components inside the stripping unit are manufactured using anti-explosion stainless steel for greater safety. An addition waste recycling system may be installed between the n-butyl acetate stripping bath and the isopropyl alcohol stripping bath. In addition, a cooling system may be installed inside the isopropyl alcohol bath to recycle the low boiling point alcohol in line with environmental considerations.

The washing unit is positioned right after the stripping unit. The washing unit is a location where a cleaning solution such as de-ionized water is sprayed on the OLED panels so that any residual isopropyl alcohol is removed. The washing unit has at least one washing bath. Each washing bath includes a storage tank, a liquid supply system and a reaction chamber. The storage tank holds de-ionized water. De-ionized water is pumped from the storage tank to the reaction chamber by the liquid supply system. Any isopropyl alcohol is removed by spraying de-ionized water onto the surface of the OLED panels. In general, a design having two serially connected washing baths are employed so that the OLED panels are washed twice in sequence. In addition, the used de-ionized water in the second washing bath can be reused by collecting and feeding to the first washing bath. In this way, some water resource is saved.

The drying unit is positioned after the washing unit. The drying unit is responsible for removing any residual de-ionized water from the surface of the OLED panels. An air knife blow drying method may be employed in the drying unit.

The control unit is a controlling device responsible for coordinating the sequence and timing of the transporting unit so that appropriate treatments of the OLED panels are provided by the stripping unit, the washing unit and the drying unit. In addition, the control unit may provide a proper engagement of the developing unit and the high-temperature baking unit with the stripping unit, the washing unit and the dry unit. The control unit can also provide some flexibility according to the use of the developing unit and maintenance.

In brief, this invention provides a photoresist stripping device and a corresponding photoresist stripping method. The apparatus and the corresponding method not only can remove a photoresist layer from the surface of an OLED panel with high cleanliness, but can also strip photoresist layer from OLED panels having various sizes en-mass in a continuous process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
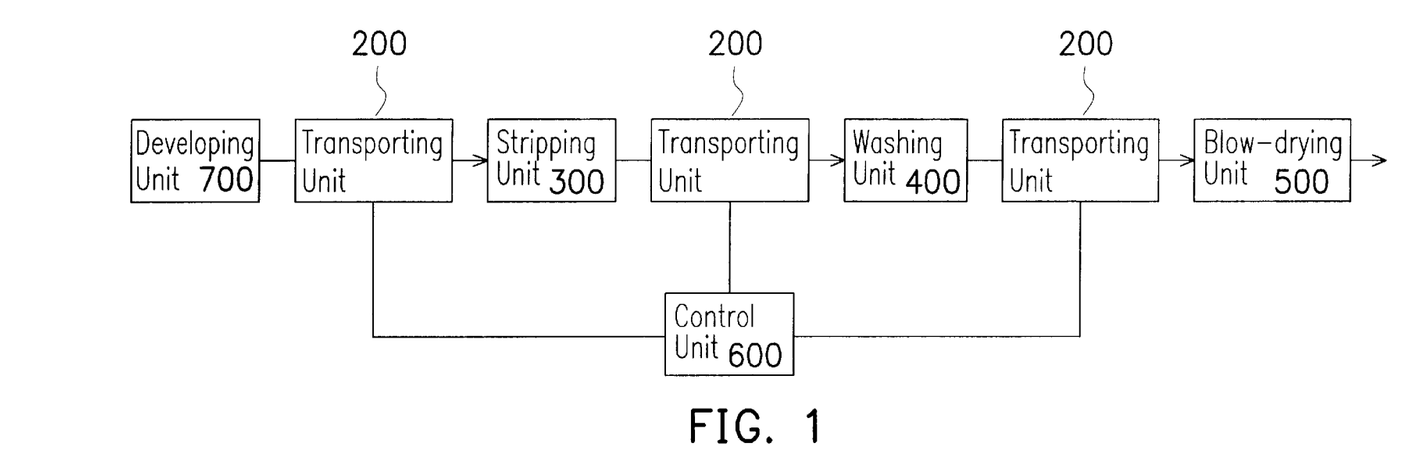
FIG. 1 is a diagram showing the layout of various components in a photoresist stripping device according to this invention.

FIG. 1 is a diagram showing the layout of various components in a photoresist stripping device according to this invention. As shown in FIG. 1, the photoresist stripping device 100 includes a transporting unit 200 that links up three operating units including a stripping unit 300, a washing unit 400 and a drying unit 500. A control unit 600 is also required to control the transport sequence and timing of the transporting unit 200.

Figure 2:
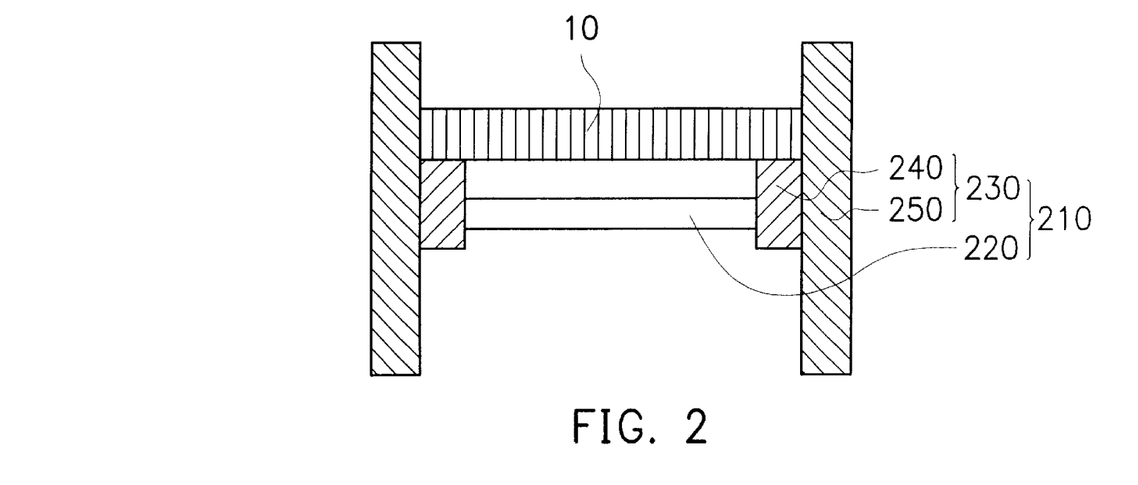
FIG. 2 is a side view of a transport roller unit used in the stripping device according to the invention.

The transporting unit 200 is responsible for moving OLED panels into the stripping unit 300, the washing unit 400 and the drying unit 500 sequentially and continuously. FIG. 2 is a side view of a transport roller unit used in the stripping device according to the invention. As shown in FIG. 2, the transporting unit 200 includes a roller unit 210. Each roller unit 210 further includes an axle 220 and a pair of rollers 230 attached to each end of the axle 220. Each roller 230 has an inner edge 240 serving as a load support and an outer edge 250 serving as a retainer. The load supporting inner edge 240 is used for supporting OLED panels 10 while the outer edge 250 is responsible for restricting the horizontal movement of the OLED panels 10 supported by the rollers 230. The OLED panels 10 are transported from one location to another via the rolling action provided by the rollers 230.

Figure 3A:
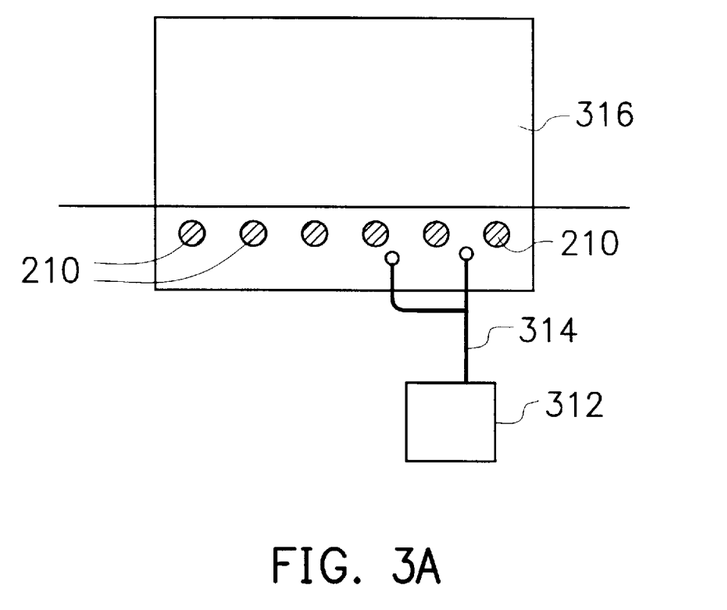
FIG. 3A is a sketch of the n-butyl acetate stripping bath used in the stripping device according to the invention.

As shown in FIG. 1, the OLED panels 10 are transported by the transport roller unit 210 from the developing unit 700 to the stripping unit 300. The stripping unit 300 at least includes an n-butyl acetate (NBA) stripping bath 310 and an isopropyl alcohol (IPA) stripping bath 320. The OLED panels 10 are transported into the n-butyl acetate stripping bath 310. FIG. 3A is a sketch of the n-butyl acetate stripping bath used in the stripping device according to the invention. As shown in FIG. 3A, the NBA bath includes a storage tank 312, a liquid supply system 314 and a reaction chamber 316. The storage tank 312 is a storage area for n-butyl acetate. NBA liquid in the storage tank 312 is transferred to the reaction chamber 316 through the liquid supply system 314. The NBA liquid reacts with photoresist material on the OLED panels 10 while shuttling inside the reaction chamber 316 to strip off the surface photoresist layer. The shuttling motion of OLED panels 10 inside the reaction chamber 316 serves to even out and quicken the removal of the photoresist material. The liquid supply system 314 pumps the NBA from the storage tank 312 and injects the NBA into the reaction chamber 316. By immersion, spraying or partial immersion and spraying of the n-butyl acetate, photoresist on the surface of an OLED panel is gradually dissolved and carried away.

Figure 3B:
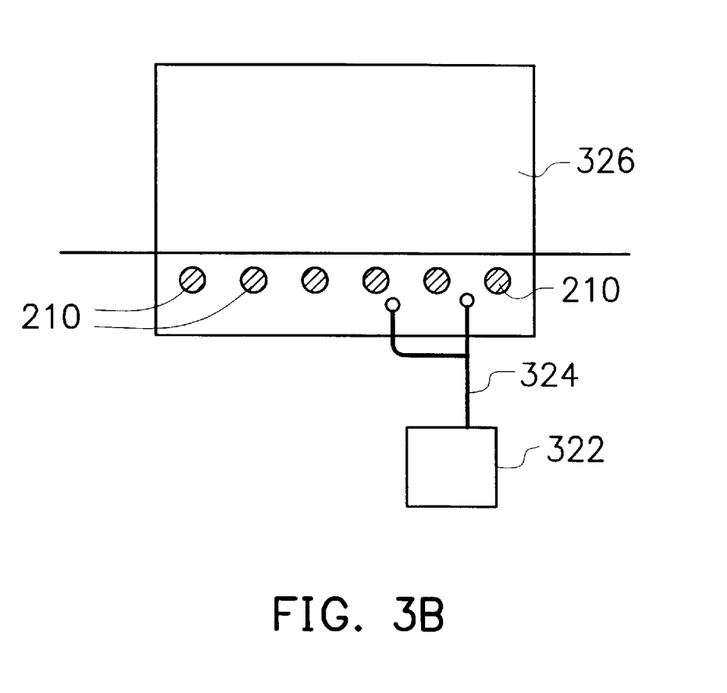
FIG. 3B is a sketch of the isopropyl alcohol cleaning bath used in the stripping device according to the invention.

FIG. 3B is a sketch of the isopropyl alcohol stripping bath used in the stripping device according to the invention. As shown in FIG. 3B, the isopropyl alcohol stripping bath 320 at least includes an isopropyl alcohol stripping bath 330. Each isopropyl alcohol stripping bath 330 also includes a storage tank 332, a liquid supply system 334 and a reaction chamber 336. The storage tank 332 holds the isopropyl alcohol. Isopropyl alcohol is pumped from the storage tank 332 to the reaction chamber 336 by the liquid supply system 334 so that the OLED panels 10 can be washed. Because isopropyl alcohol has a relatively low boiling point, the OLED panels are washed by immersion rather than by spraying to reduce alcohol vapor generation. In general, the components inside the stripping unit 300 are manufactured using anti-explosion stainless steel for greater safety. An addition waste recycling system may be installed between the n-butyl acetate stripping bath 310 and the isopropyl alcohol stripping bath 320. In addition, a cooling system may be installed inside the isopropyl alcohol stripping bath 330 to recycle the low boiling point alcohol in line with environmental regulations.

Figure 4:
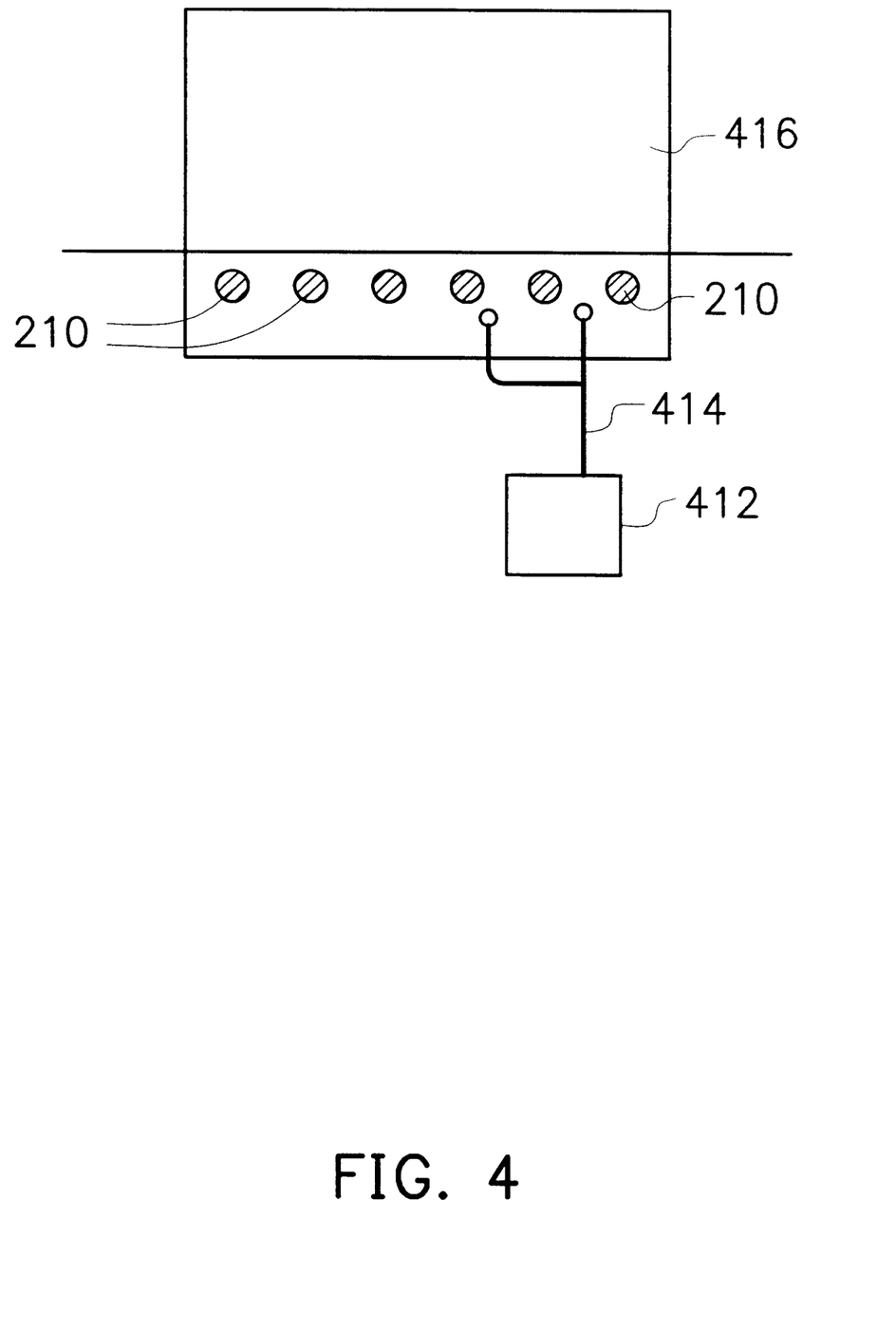
FIG. 4 is a sketch of the washing bath used in the stripping device according to the invention.

As shown in FIG. 1, the washing unit 400 is positioned right after the stripping unit 300. The washing unit 400 is a place in which cleaning solution such as de-ionized water is sprayed on the OLED panels 10 so that any residual isopropyl alcohol is removed. The washing unit 400 has at least one washing bath 410. FIG. 4 is a sketch of the washing bath used in the stripping device according to the invention. As shown in FIG. 4, each washing bath 410 includes a storage tank 412, a liquid supply system 414 and a reaction chamber 416. The storage tank 412 holds de-ionized water. De-ionized water is pumped from the storage tank 412 to the reaction chamber 416 by the liquid supply system 414. Any isopropyl alcohol is removed by spraying de-ionized water onto the surface of the OLED panels 10. In general, a design having two serially connected washing baths 340 and 350 are employed so that the OLED panels 10 are washed twice in sequence. In addition, the used de-ionized water in the second washing bath 350 can be reused by collecting and feeding to the first washing bath 340. In this way, some water resource is saved.

As shown in FIG. 1, the drying unit 500 is positioned after the washing unit 400. The drying unit 500 is responsible for removing any residual de-ionized water from the surface of the OLED panels 10. An air knife blow-drying method may be employed in the drying unit 500.

The control unit 600 is a controlling device responsible for coordinating the sequence and timing of the transporting unit 200 so that appropriate treatments of the OLED panels 10 are provided by the stripping unit 300, the washing unit 400 and the drying unit 500. In addition, the control unit may provide a proper engagement of the developing unit 700 with the stripping unit 300, the washing unit 400 and the drying unit 500. The control unit 600 can also provide some flexibility according to the use of the developing unit 700 and maintenance.

Figure 5:
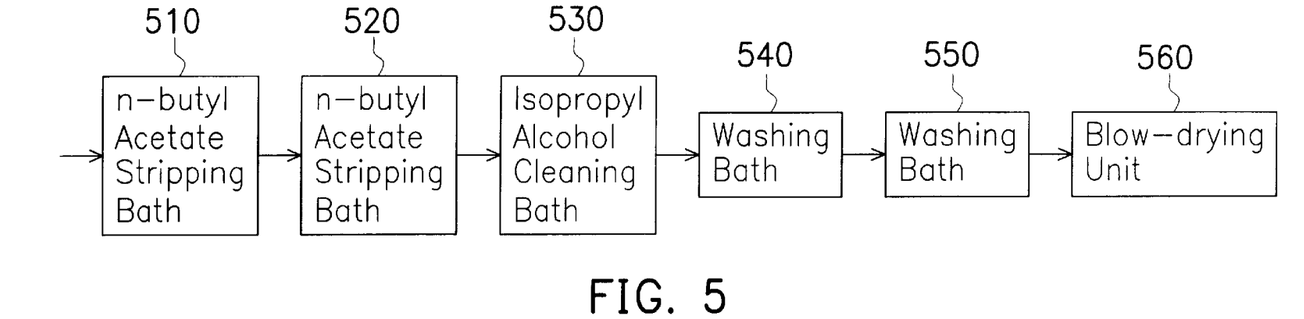
FIG. 5 is a block diagram that shows the layout of the various components of the photoresist stripping device and the operating sequence for conducting the stripping operation according to a first preferred embodiment of the invention.

FIG. 5 is a block diagram that shows the layout of the various components of the photoresist stripping apparatus and the operating sequence for conducting the stripping operation according to a first preferred embodiment of the invention. The transporting unit 200 has a function similar to the embodiment shown in FIG. 1. As shown in FIG. 5, the OLED panels 10 (not shown) is transported to a n-butyl acetate (NBA) stripping bath 510 to carry out a first NBA treatment. The OLED panels 10 are next transferred to a second NBA stripping bath 520. The purpose of having a second NBA bath is to remove any possible residual photoresist that still clings to the OLED panel surface.

The OLED panels 10 are moved to an isopropyl alcohol (IPA) stripping bath 530. The IPA stripping bath 530 is positioned after the second NBA stripping bath 520. The IPA bath 530 not only removes any residual photoresist clinging on the OLED panel surface, but also removes any residual n-butyl acetate on the surface of the OLED panels 10.

The OLED panels 10 are moved by the transporting unit 200 to a washing bath 540 so that the OLED panels 10 are washed by de-ionized water. After a preliminary washing step, the OLED panels 10 are moved to a second washing bath 550 to carry out another washing with de-ionized water so that any residual isopropyl alcohol is removed.

Finally, the OLED panels 10 is transferred to a blow drying unit 560 where an air knife drying method is used, thereby completing the process of stripping a photoresist layer off each OLED panel 10.

Figure 6:
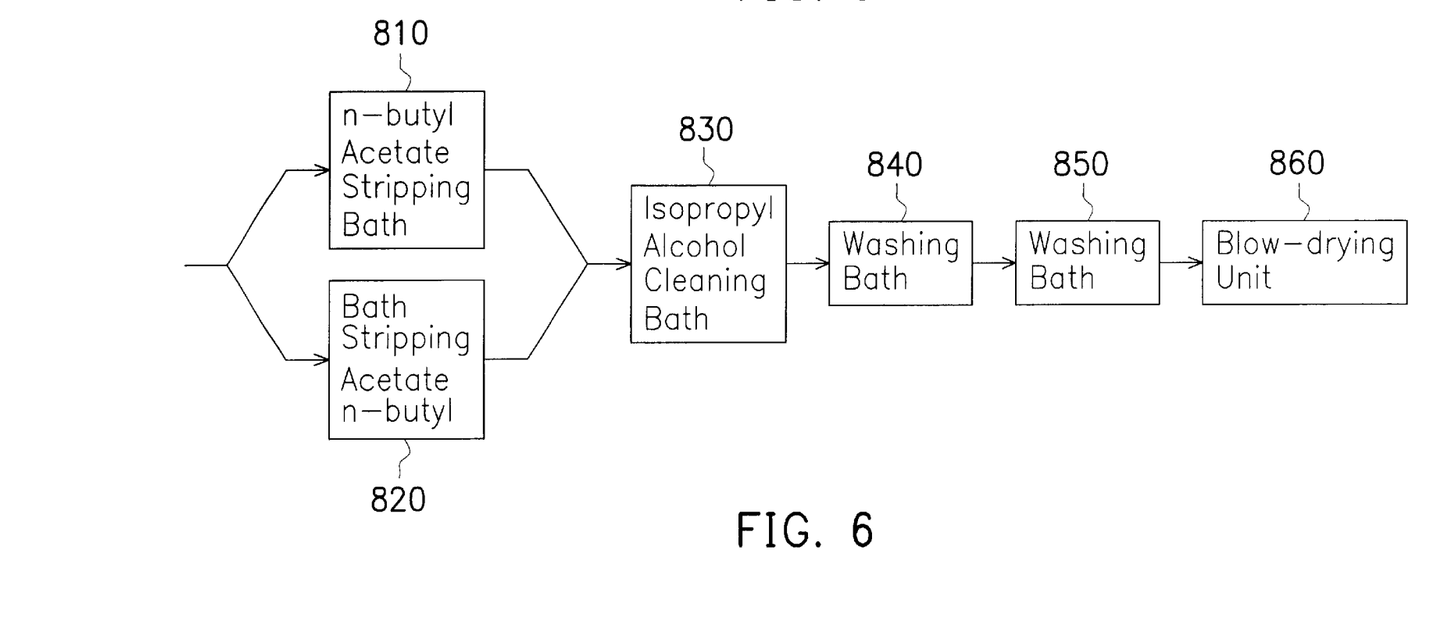
FIG. 6 is a block diagram that shows the layout of the various components of the photoresist stripping device and the operating sequence for conducting the stripping operation according to a second preferred embodiment of the invention.

FIG. 6 is a block diagram that shows the layout of the various components of the photoresist stripping apparatus and the operating sequence for conducting the stripping operation according to a second preferred embodiment of the invention. The transporting unit 200 has a function similar to the embodiment shown in FIG. 1. As shown in FIG. 6, an OLED panel 20 (not shown) is transported to an n-butyl acetate (NBA) stripping bath 810 to carry out a NBA treatment for removing photoresist material. Meanwhile, another OLED panel 30 (not shown) is transported to another n-butyl acetate (NBA) stripping bath 820 to carry out a NBA treatment for removing photoresist material. The first NBA stripping bath 810 and the second NBA stripping bath 820 are positioned in parallel. The main advantage of having two or more NBA stripping baths arranged in parallel is that more OLED panels 10 can be treated at the same time.

After the NBA treatment, the OLED panel 20 is transferred to an isopropyl alcohol (IPA) stripping bath 830. Meanwhile, another OLED panel 40 (not shown) is passed into the NBA stripping bath 810 to carry out NBA treatment. The IPA stripping bath 830 is positioned after the NBA stripping baths 810 and 820. The IPA stripping bath 830 is responsible for removing any residual photoresist material as well as any residual n-butyl acetate clinging to the surface of the OLED panels.

The OLED panel 20 is next transferred to a washing bath 840 and cleaned by spraying de-ionized water. Meanwhile, the OLED panel 30 is transferred to the IPA stripping bath 830 and another OLED panel 50 (not shown) is transferred to the NBA stripping bath 820 for n-butyl acetate treatment. After passing through the washing bath 840, the OLED panel 20 is transferred to another washing bath 850 for further cleaning using de-ionized water. Finally, the OLED panel 20 is dried in a drying unit 860 that employs an air knife drying method. After the series of steps, the photoresist layer on the OLED panel 20 is completely removed.

Figure 7:
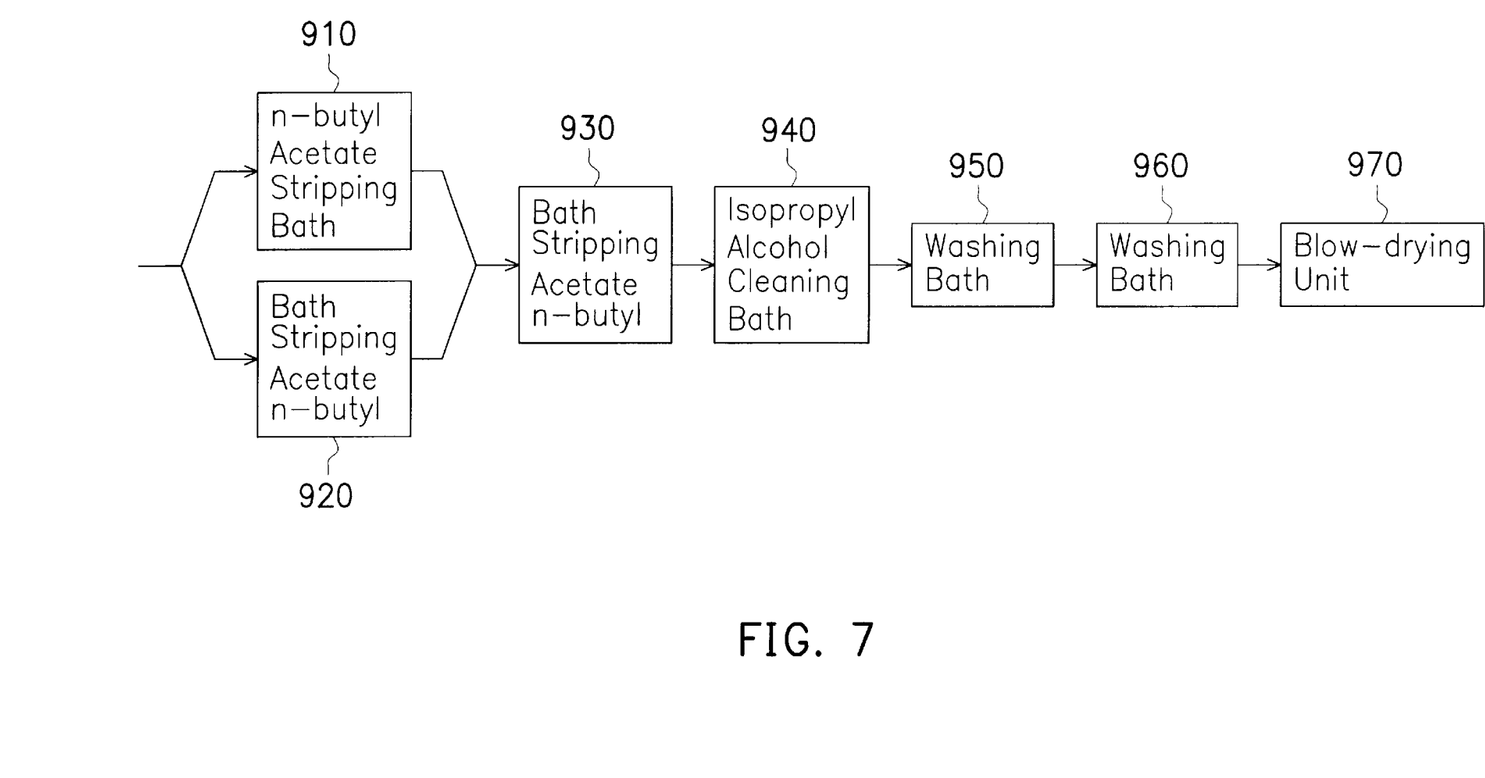
FIG. 7 is a block diagram that shows the layout of the various components of the photoresist stripping device and the operating sequence for conducting the stripping operation according to a third preferred embodiment of the invention.

FIG. 7 is a block diagram that shows the layout of the various components of the photoresist stripping apparatus and the operating sequence for conducting the stripping operation according to a third preferred embodiment of the invention. The transporting unit 200 has a function similar to the embodiment shown in FIG. 1. As shown in FIG. 7, an OLED panel 60 (not shown) is transported to an n-butyl acetate (NBA) stripping bath 910 to carry out a NBA treatment for removing photoresist material. Meanwhile, another OLED panel 70 (not shown) is transported to another n-butyl acetate (NBA) stripping bath 920 to carry out a NBA treatment for removing photoresist material. The first NBA stripping bath 910 and the second NBA stripping bath 920 are positioned in parallel. After a first NBA treatment, the OLED panel 60 is transferred to another NBA stripping bath 930. At the same time, another OLED panel 80 (not shown) is transferred to the NBA stripping bath 910 to perform an initial NBA treatment. The NBA stripping bath 930 and the NBA stripping bath 910 are serially connected. By introducing a second NBA treatment, a complete removal of the photoresist material from the OLED panels is ensured.

After the second NBA treatment in the NBA stripping bath 930, the OLED panel 60 is transferred to an isopropyl alcohol (IPA) stripping bath 940. Meanwhile, the OLED panel 70 is transferred to the NBA stripping bath 930 and another OLED panel (not shown) is transferred to the NBA stripping bath 920 to carry out initial NBA treatment. The IPA stripping bath 940 is positioned after the NBA stripping bath 930. The IPA stripping bath 940 is responsible for removing any residual photoresist material as well as any n-butyl acetate clinging to the surface of the OLED panels.

The main advantage of having two or more NBA stripping baths arranged in parallel is that more OLED panel can be treated at the same time. Note that the parallel-serial arrangement is not limited to three NBA stripping baths. In fact, any number of NBA baths can be configured in a parallel-serial arrangement.

After passing the IPA stripping bath 940, the OLED panel 60 is transferred to a washing bath 950 for cleaning using de-ionized water. Meanwhile, the OLED panel 70 is transferred to the IPA stripping bath 940 and the OLED panel 80 is transferred to the NBA stripping bath 930 for n-butyl acetate treatment.

The OLED panel 60 is next moved from the washing bath 950 to another washing bath 960 to carry out another washing with de-ionized water. Finally, the OLED panel 60 is dried in a drying unit 970 that employs an air knife drying method. After the series of steps, the photoresist layer on the OLED panel 60 is completely removed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photoresist stripping apparatus for stripping off photoresist material from the surface of an organic light-emitting display (OLED), comprising:

a stripping unit that provides a stripping to remove photoresist on the surface of the OLED panel;

a washing unit that sprays a cleaning solution to remove any residual stripping agent on the surface of the OLED panel;

a blow-drying unit for drying the OLED panel;

a transporting unit for continuously transferring OLED panels to the stripping unit, the washing unit and the blow-drying unit;

a control unit for controlling the sequence and timing of transfer of OLED panels to each treatment unit;

a carrier unit for holding waiting OLED panels or providing a buffer region for holding OLED panel after photoresist development so that the OLED panels may be directly transferred to a subsequent module; and a downloading unit for holding photoresist stripped OLED panels or providing a buffer region for holding photoresist stripped OLED panels so that the photoresist stripped OLED panels may be directly transferred to a high-temperature baking module.

2. The apparatus of claim 1, wherein the stripping unit includes a plurality of n-butyl stripping baths and a plurality of isopropyl alcohol stripping baths.

3. The apparatus of claim 2, wherein the n-butyl acetate stripping baths are positioned to form a serial configuration, a parallel configuration or a mixture of both.

4. The apparatus of claim 2, wherein the isopropyl alcohol stripping baths are positioned to form a serial configuration, a parallel configuration or a mixture of both.

5. The apparatus of claim 2, wherein the isopropyl alcohol stripping baths are positioned behind the n-butyl acetate stripping baths.

6. The apparatus of claim 1, wherein the washing unit includes a plurality of washing baths.

7. The apparatus of claim 6, wherein the cleaning baths are positioned serially.

8. A photoresist stripping apparatus for stripping off photoresist material from the surface of an organic light-emitting display (OLED), comprising:

a stripping unit that provides a stripping solution to remove photoresist on the surface of the OLED panel;

a washing unit that sprays a cleaning solution to remove any residual stripping agent on the surface of the OLED panel;

a blow-drying unit for drying the OLED panel;

a transporting unit for continuously transferring OLED panels to the stripping unit, the washing unit and the blow-drying unit; and a control unit for controlling the sequence and timing of transfer of OLED panels to each treatment unit.

9. The apparatus of claim, 8, wherein the apparatus further includes a carrier unit for holding waiting OLED panels or providing a buffer region for holding OLED panel after photoresist development so that the OLED panels may be directly transferred to a subsequent module.

10. The apparatus of claim 8, wherein the apparatus further includes a downloading unit for holding photoresist stripped OLED panels or providing a buffer region for holding photoresist stripped OLED panels so that the photoresist stripped OLED panels may be directly transferred to a high-temperature baking module.

11. The apparatus of claim 8, wherein the stripping unit includes a plurality of n-butyl stripping baths and a plurality of isopropyl alcohol stripping baths.

12. The apparatus of claim 11, wherein the n-butyl acetate stripping baths are positioned to form a serial configuration, a parallel configuration or a mixture of both.

13. The apparatus of claim 11, wherein the isopropyl alcohol stripping baths are positioned to form a serial configuration, a parallel configuration or a mixture of both.

14. The apparatus of claim 11, wherein the isopropyl alcohol stripping baths are positioned behind the n-butyl acetate stripping baths.

15. The apparatus of claim 8, wherein the washing unit includes a plurality of washing baths.

16. The apparatus of claim 15, wherein the cleaning baths are positioned serially.

* * * * *